(12) United States Patent
McFarthing

(10) Patent No.: US 8,314,659 B2
(45) Date of Patent: Nov. 20, 2012

(54) CONTROLLING AMPLIFIER INPUT IMPEDANCE

(75) Inventor: Anthony Lawrence McFarthing, Cambridgeshire (GB)

(73) Assignee: Cambridge Silicon Radio Limited, Cambridgeshire (GB)

( * ) Notice: Subject to any disclaimer, the term of this patent is extended or adjusted under 35 U.S.C. 154(b) by 0 days.

(21) Appl. No.: 12/595,470

(22) PCT Filed: Apr. 10, 2008

(86) PCT No.: PCT/GB2008/001258
§ 371 (c)(1),
(2), (4) Date: Dec. 22, 2009

(87) PCT Pub. No.: WO2008/125817
PCT Pub. Date: Oct. 23, 2008

(65) Prior Publication Data
US 2010/0201450 A1    Aug. 12, 2010

(30) Foreign Application Priority Data

Apr. 13, 2007  (GB) .................................. 0707185.5

(51) Int. Cl.
*H03F 3/04* (2006.01)
(52) U.S. Cl. ........................................ 330/302; 330/277
(58) Field of Classification Search .................. 330/302, 330/277, 292, 67
See application file for complete search history.

(56) References Cited

U.S. PATENT DOCUMENTS

| 5,159,289 | A  |   | 10/1992 | Zametzer et al. |        |
|-----------|----|---|---------|-----------------|--------|
| 5,917,210 | A  | * | 6/1999  | Huang et al.    | 257/292 |
| 2002/0116691 | A1 | * | 8/2002 | Tsai | 716/4 |
| 2006/0194558 | A1 | * | 8/2006 | Kelly | 455/319 |
| 2007/0216501 | A1 | * | 9/2007 | Tsai et al. | 333/262 |
| 2007/0252643 | A1 | * | 11/2007 | Nishimoto et al. | 327/574 |
| 2009/0079724 | A1 | * | 3/2009 | Dou | 345/212 |

FOREIGN PATENT DOCUMENTS

| JP | 4-256208 | 9/1992 |
| JP | 11-298260 | 10/1999 |
| JP | 2000-286647 | 10/2000 |
| JP | 2006-67058 | 9/2007 |

OTHER PUBLICATIONS

Jhon Hee Sauk, et al., "16GHz CMOS LNA Design Without Source Degeneration Inductor", IEIC Technical Report, vol. 105, No. 155, 2005 (Abstract).

Chung-Yu Wu., "A Low-Voltage, CMOS LNA Design Utilizing the Technique of Capacitive Feedback Matching Network", Electronics, Circuits and Systems, 2006, pp. 78-81.

Qiang Li et al., "An Inductorless Low-Noise Amplifier with Noise Cancellation for UWB Receiver Front-End", Solid-State Circuits State Circuits Conference, 2006, pp. 267-270.

Sackinger et al., A General Relationship Between Amplifier Parameters, and Its Application to PSRR Improvement, IEEE Transactions on Circuits and Systems, vol. 38, No. 10, Oct. 1991, pp. 1-9.

Chung-Yu Wu, "A Low-Voltage CMOS LNA Design Utilizing the Technique of Capacitive Feedback Matching Network," ICECS 2006, IEEE, 2006, pp. 78-81.

* cited by examiner

*Primary Examiner* — Henry Choe
(74) *Attorney, Agent, or Firm* — Mark J. Danielson; Pillsbury Winthrop Shaw Pittman LLP

(57) ABSTRACT

An amplifier (22) containing an arrangement of capacitive elements (26, 28) in place of a source degeneration inductor arrangement to set the real part of the amplifier's input impedance.

6 Claims, 3 Drawing Sheets

CONTROLLING AMPLIFIER INPUT IMPEDANCE

This Application is a National Stage filing under 35 U.S.C. §371 of International Application No. PCT/GB2008/001258, filed Apr. 10, 2008, which in turn claims the benefit of priority based on United Kingdom Patent Application No. GB 0707185.5, filed Apr. 13, 2007, each of which is incorporated by reference herein in its entirety, as is fully set forth herein. International Application No. PCT/GB2008/001258 has been published as International Publication No. WO 2008/125817, on Oct. 23, 2008.

The present invention relates to apparatus for and methods of controlling the input impedance of amplifiers.

One field to which the invention has application is that of low noise amplifiers (LNAs) such as are used in radio signal receivers.

A radio receiver can be implemented in silicon, as in the case of the BlueCore4 chip from Cambridge Silicon Radio Limited, for example.

Figure 1:
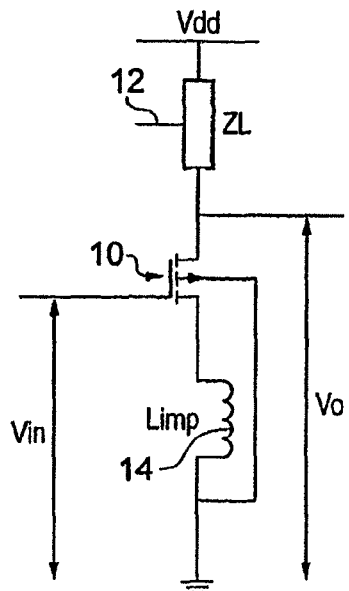

FIG. 1 shows a circuit diagram of a LNA based on a MOSFET transistor 10. A load 12 is connected between the drain terminal of the transistor 10 and the supply rail $V_{dd}$. An inductor 14 is connected between the source terminal of the transistor 10 and ground. The body terminal of the transistor 10 is connected to ground. Appropriate choice of the inductance of inductor 14, allows the real part of the input impedance of a given LNA to be set to a desired value.

Figure 2:
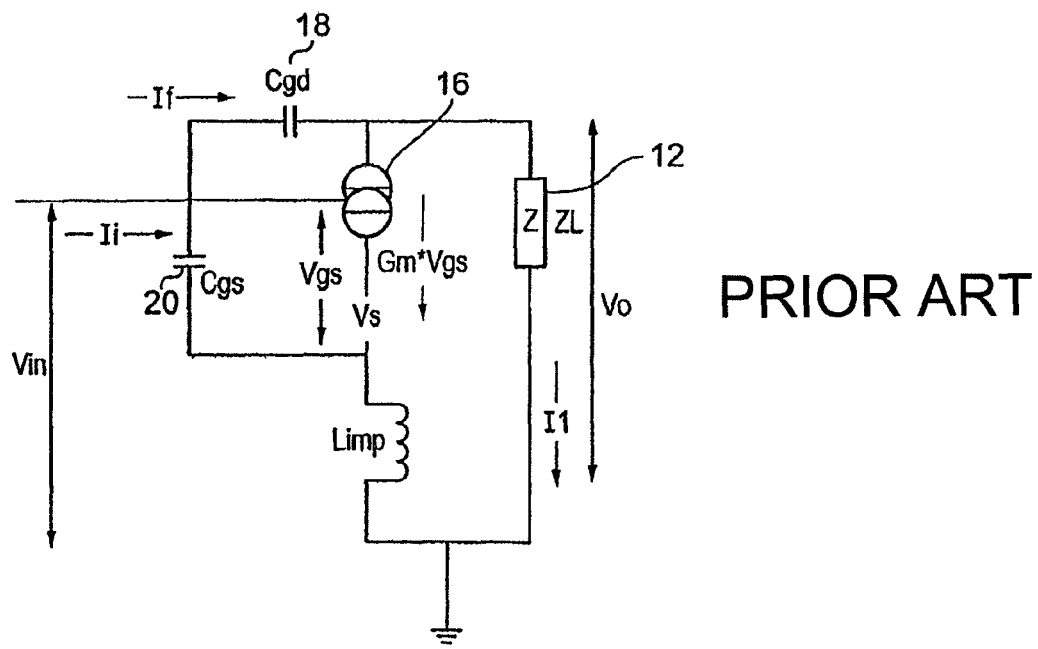

FIG. 2 shows a simplified model of the LNA of FIG. 1. In FIG. 2, the transistor 10 appears as a voltage controlled current source 16 with a capacitor 18 between the transistor's gate and drain terminals and with a further capacitor 20 between the transistor's gate and source terminals. The capacitors 18 and 20 model the gate-to-drain and gate-to-source intrinsic capacitances, respectively, that occur within the transistor 10. For example, within a transistor the gate to source capacitance arises from the area between the gate connection and the transistor's channel. The model of FIG. 2 can be used to calculate the input impedance of the LNA:

$$\frac{Vin}{Ii} = \frac{(s \cdot Cgd \cdot ZL + 1) \cdot (gm \cdot Limp + 1 + s \cdot Ggs \cdot Limp)}{s \cdot (gm \cdot Cgd \cdot ZL + s \cdot Cgd \cdot Cgs \cdot ZL + Cgd \cdot gm \cdot Limp + Cgd + s \cdot Cgd \cdot Cgs \cdot Limp + Cgs)}$$

where:
  ZL is the impedance of load 12
  gm is the gain of the LNA
  Limp is the impedance of the inductor 14
  Cgd is the capacitance of capacitor 18 between the transistor's gate and drain terminals
  Cgs is the capacitance of capacitor 20 between the transistor's gate and source terminals
  s is $i\omega$, where $\omega$ is the angular frequency of the input voltage signal If Cgd is assumed to be zero and if Limp is considered to be entirely reactive (i.e. Limp=$i\omega L$) then the equation for the input impedance can be shown to reduce to:

$$Zin = s \cdot L + \frac{1}{s \cdot Cgs} + \frac{gm}{Cgs} \cdot L$$

Zin contains a resistive part $$\frac{gm}{Cgs} \cdot L$$

and a reactive part $$s \cdot L + \frac{1}{s \cdot Cgs}.$$

However, the resistive part is generated by non-resistive components which means that the resistive part of Zin does not produce thermal noise—which is why the inductor shown in FIG. 1 is employed in low noise amplifiers.

Although the circuit of FIG. 1 has good noise characteristics there is a significant drawback when it comes to implementing the circuit in silicon: the inductor 14 will take up a relatively large amount of area, compared to other analog components, when implemented in an integrated circuit.

According to one aspect, the invention provides an amplifier containing an arrangement of capacitive elements to provide the function of a source degeneration inductor arrangement in determining the real part of the amplifier's input impedance. According to another aspect, the invention provides an amplifier comprising a transistor, having first, second and third terminals, and first and second capacitive elements, wherein the first capacitive element is located between the first terminal and one of the other two terminals and the second capacitive element is located between the second and third terminals such that the capacitive elements co-operate such that the real part of the amplifier's input impedance is substantially provided by reactive elements.

Thus, the invention provides a way of tailoring the input impedance of a low noise amplifier that can avoid the use of a relatively large inductor.

In certain embodiments the transistor is a MOSFET transistor and the first, second and third terminals are gate, source and drain terminals, respectively.

The capacitive elements can be provided by discrete capacitors or by capacitance intrinsic to the transistor or by a combination of both.

Figure 3:
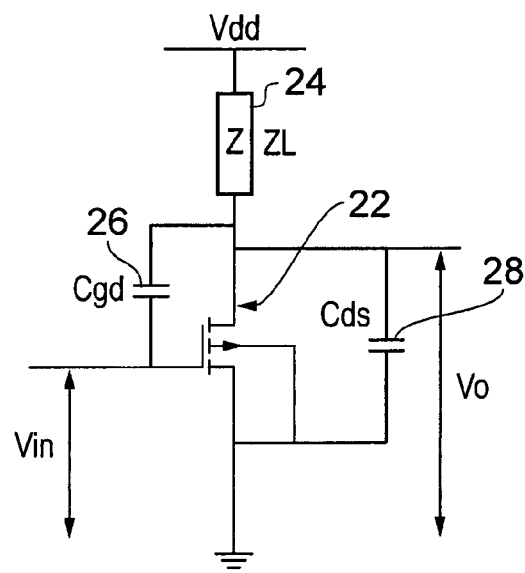
Figure 4:
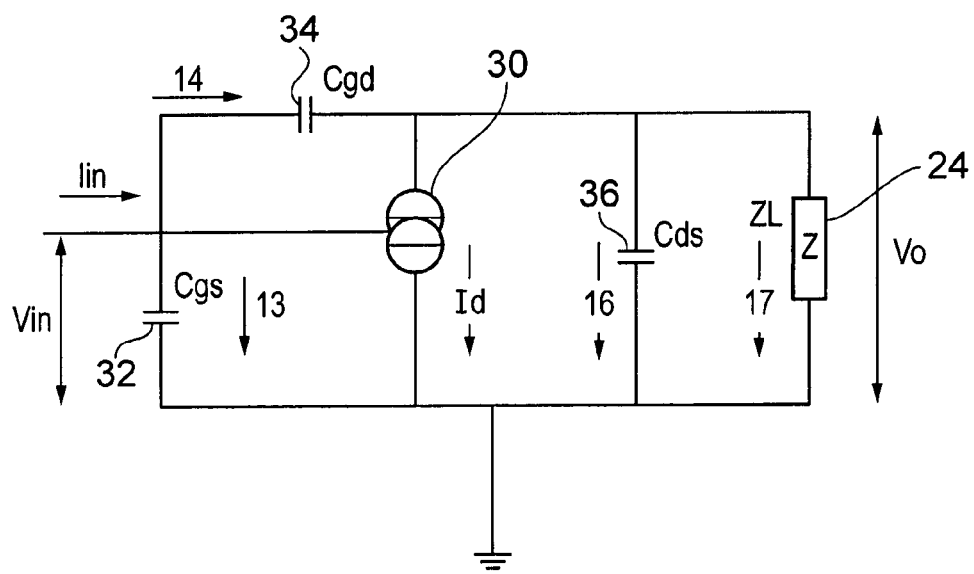
Figure 5:
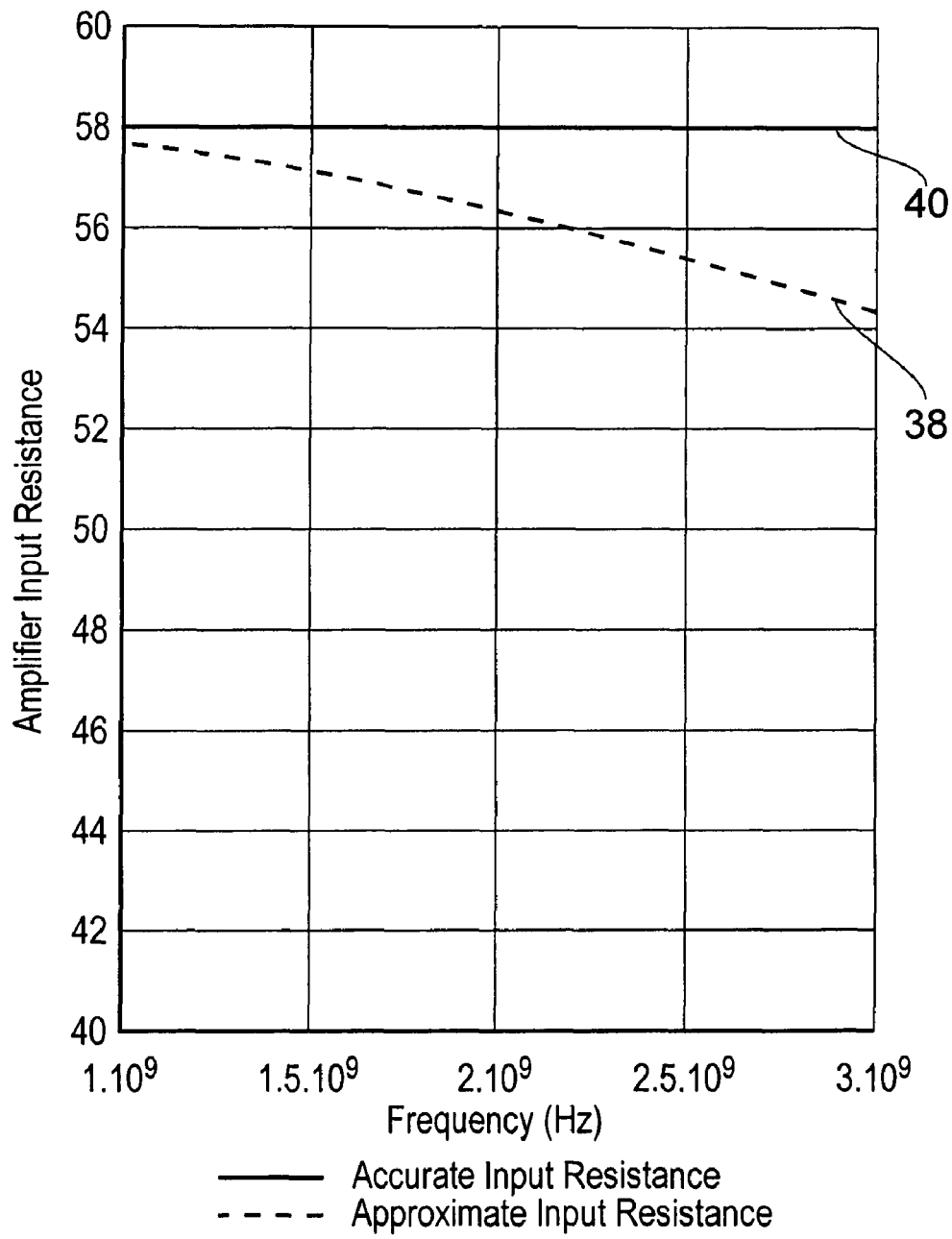

By way of example only, an embodiment of the present invention will now be described by reference to the accompanying drawings in which:

FIG. 1 illustrates a conventional LNA circuit;
FIG. 2 illustrates a model of the circuit of FIG. 1;
FIG. 3 illustrates a LNA circuit according to an embodiment of the invention;
FIG. 4 illustrates a model of the circuit of FIG. 3; and
FIG. 5 is a chart plotting, versus input voltage frequency, two different formulae of the real part of the input impedance of the amplifier of FIG. 3.

Like FIG. 1, FIG. 3 shows a LNA based on a common source MOSFET transistor 22. A load 24 (which could be a complex impedance) is connected between the drain terminal of the transistor 22 and the supply rail $V_{dd}$. A capacitor 26 is connected between the gate and drain terminals of the transistor 22. Another capacitor 28 is connected between the drain and source terminals of the transistor 22. The body terminal of the transistor 22 is connected to the source terminal.

FIG. 4 shows a model of the LNA of FIG. 3. In FIG. 4, the transistor 22 appears as a voltage-controlled current source 30 with a capacitor 32 between its source and gate terminals, a capacitor 34 between its gate and drain terminals and a capacitor 36 between its source and drain terminals. The intrinsic capacitance between the transistor's gate and source terminals appears as capacitor 32 in FIG. 4. Capacitor 34 represents the sum of the intrinsic capacitance between the transistor's gate and the drain terminals and the capacitance of capacitor 26 of FIG. 3. Capacitor 36 represents the sum of the intrinsic capacitance between the transistor's source and the drain terminals and the capacitance of capacitor 28 of FIG. 3.

From circuit analysis, we have the following formulae for the various currents in FIG. 4:

$$Iin = I3 + I4$$
$$Id = Vin \cdot gm$$
$$I4 = Vin \cdot s \cdot Cgs$$
$$I3 = (Vin - Vo) \cdot s \cdot Cgd$$
$$I3 = Id + I5$$
$$I5 = I6 + I7$$
$$I6 = Vo \cdot s \cdot Cds$$
$$I7 = \frac{Vo}{ZL}$$

The simultaneous equations can be reduced to the following equation by substitution in a conventional manner:

$$Zin = \frac{Cds + Cgd - \frac{i}{\omega \cdot ZL}}{gm \cdot Cgd + \frac{Cgd}{ZL} + \frac{Cgs}{ZL} + i \cdot \omega \cdot (Cds \cdot Cgd + Cgs \cdot Cds + Cgs \cdot Cgd)} \quad \text{equation 1}$$

Where Zin=Vin/Iin

By separating this equation into real and imaginary parts it can be shown that the real part of Zin becomes:

$$Real\_Zin = \frac{(Cds + Cgd) \cdot \left(gm \cdot Cgd + \frac{Cgd}{ZL} + \frac{Cgs}{ZL}\right) - \frac{Cds \cdot Cgd + Cgs \cdot Cds + Cgs \cdot Cgd}{ZL}}{\left(gm \cdot Cgd + \frac{Cgd}{ZL} + \frac{Cgs}{ZL}\right)^2 + \omega^2 \cdot (Cds \cdot Cgd + Cgs \cdot Cds + Cgs \cdot Cgd)^2}$$

ZL, in practice, can be made purely resistive and very large in relation to the other parameters in this equation so that it can be simplified to:

$$Real\_Zin = \frac{(Cds \cdot Cgd)}{gm \cdot Cgd + \frac{\omega^2 \cdot (Cds \cdot Cgd + Cgs \cdot Cds + Cgs \cdot Cgd)^2}{gm \cdot Cgd}}$$

If typical values for reasonably sized components are used (see list below) then the second part of the denominator in the above equation can be shown to be smaller in magnitude in comparison to the first part of the denominator. A simplified version of the formula can therefore be obtained for the real part of the input impedance (which is useful for quick computational requirements) as follows:

$$Real\_Zin = \frac{Cds + Cgd}{gm \cdot Cgd} \quad \text{equation 2}$$

Thus, for the LNA of FIG. 3, the resistive part (i.e. the real part) of the input impedance is once again provided by purely reactive components which will not produce thermal noise. However, in the circuit of FIG. 3 this is achieved without the use of an inductor, which means that the circuit of FIG. 3 can be implemented in an integrated circuit using much less area than the circuit of FIG. 1.

In FIG. 5, the real part of the input impedance is plotted for the new design. The lower line 38 represents the real part of equation 1 and the upper line 40 represents a plot of equation 2. Although the required frequency range may require quite different valued components to be selected, the following values were used to demonstrate the design principle for a 2.5 GHz design:

Cgd—0.1 pF
Cds—1.0 pF
Cgs—0.15 pF
RL—100KΩ
gm—0.19

It will be recalled that s is iω and it will of course be recognised that w is $2\pi f$. In the plot of FIG. 5, f has been varied over the range 1-3 GHz. It will be apparent that over the 2 GHz range shown, there is no worse than a 7% discrepancy between the real part of equation 1 and its approximation as provided by equation 2.

In the embodiment of FIGS. 3 and 4, capacitors 26 and 28 augment the intrinsic gate-to-drain and source-to-drain capacitances of the transistor 22. In other embodiments, the transistor could be designed to tailor these intrinsic capacitances to provide desired levels of capacitance without need for external capacitors such as 26 and 28 of FIG. 3.

The transistor technology used in the amplifier according to the invention can be NMOS or PMOS CMOS or it could be based on any other active device producing an inversion between input and output, including a bipolar transistor, either NPN or PNP.

The invention claimed is:

1. An amplifier containing an arrangement of capacitors to provide a function of a source degeneration inductor arrangement in determining a real part of the amplifier's input impedance, and a transistor, having first, second and third terminals, and the arrangement of capacitors comprising first and second capacitors, wherein the first capacitor is located between the first terminal and another one of the terminals and the second capacitor is located between the second and third terminals, and at least one of the capacitors is a non-parasitic capacitor.

2. An amplifier comprising a transistor, having first, second and third terminals, and first and second capacitors, wherein the first capacitor is located between the first terminal and another one of the terminals and the second capacitor is located between the second and third terminals such that the capacitors cooperate such that the real part of the amplifier's input impedance is substantially provided by reactive elements, wherein at least one of the capacitors is a non-parasitic capacitor.

3. An amplifier according to claim 2, wherein the first, second and third terminals are gate, source and drain terminals, respectively.

4. An amplifier according to claim 1, wherein the amplifier is a LNA.

5. An integrated circuit containing the amplifier of claim 1.

6. A radio receiver containing the amplifier of claim 1.

* * * * *

UNITED STATES PATENT AND TRADEMARK OFFICE
CERTIFICATE OF CORRECTION

| | |
|---|---|
| PATENT NO. | : 8,314,659 B2 |
| APPLICATION NO. | : 12/595470 |
| DATED | : November 20, 2012 |
| INVENTOR(S) | : McFarthing |

It is certified that error appears in the above-identified patent and that said Letters Patent is hereby corrected as shown below:

In Column 4, Line 19, delete "w" and insert -- ω --, therefor.

Signed and Sealed this
Fifth Day of February, 2013

Teresa Stanek Rea
*Acting Director of the United States Patent and Trademark Office*